United States Patent
Degani et al.

[11] Patent Number: 6,130,141
[45] Date of Patent: Oct. 10, 2000

[54] FLIP CHIP METALLIZATION

[75] Inventors: Yinon Degani, Highland Park, N.J.; Jeffrey Alan Gregus, Bethlehem, Pa.

[73] Assignee: Lucent Technologies Inc., Murray Hill, N.J.

[21] Appl. No.: 09/172,467

[22] Filed: Oct. 14, 1998

[51] Int. Cl.[7] .............................. H01L 21/30; H01L 21/46
[52] U.S. Cl. ...................... 438/455; 438/456; 438/458
[58] Field of Search .................................. 438/455, 456, 438/458, 612

[56] References Cited

U.S. PATENT DOCUMENTS 5,773,359  6/1998  Mitchell et al. .
5,904,859  5/1999  Degani .
5,985,694  11/1999  Cho .

*Primary Examiner*—Kevin M. Picardat
*Assistant Examiner*—D. Mark Collins
*Attorney, Agent, or Firm*—Thomas, Kayden, Horstemeyer & Risley LLP

[57] ABSTRACT

The specification describes techniques for applying under bump metallization (UBM) for solder bump interconnections on IC chips with Al bonding sites. The UBM of the invention comprises a copper layer applied directly to the aluminum bonding sites. Reliable bonds are obtained if the Al surface is a nascent surface. Such a surface can be provided by back sputtering an aluminum bonding site, or by a freshly sputtered aluminum layer. The copper layer is deposited on the nascent aluminum surface in e.g. a cluster tool without breaking vacuum. The UBM can be patterned using subtractive techniques.

8 Claims, 3 Drawing Sheets

FLIP CHIP METALLIZATION

FIELD OF THE INVENTION

This invention relates to electronic assembly technology and more specifically to solder bump interconnections for mounting IC chips and the like on interconnection substrates like silicon, ceramic, or printed circuit boards.

BACKGROUND OF THE INVENTION

Solder bump interconnection techniques for both electrically contacting component packages and mounting them on interconnection substrates such as printed circuit boards has become widely used in the manufacture of electronic devices. Interconnection substrates includes several forms of electronic device supports including, e.g., silicon and ceramic. For convenience reference to such supports herein will be to printed wiring boards as a generic term.

State of the art component packages are small and lightweight and can be surface mounted to printed circuit boards using fine patterns of solder bumps. Typically, bumps or pads are formed on both the printed wiring board and the component package in mirror arrays that mate when the component package is properly placed. Assembly is completed by applying heat to melt the solder and form the solder bond and interconnection. This technique is used in flip-chip technology where the surface of the IC chip in the component package is provided with bonding pads or bumps and the chip is mounted upside down on the printed wiring board.

The solder bumps are formed on arrays of I/O contact pads prior to assembly. To facilitate localized or selective application of solder to the array of contact pads the surface of the pads should be solder wettable. The metal interconnection pattern typically used for integrated circuits boards or cards is aluminum. While techniques for soldering directly to aluminum have been tried, it is widely accepted that aluminum is not a desirable material to solder. Consequently the practice in the industry is to apply a metal coating on the aluminum contact pads, and apply the solder bump or pad to the coating. This coating is referred to as under bump metallization (UBM).

The metal or metals used in UBM technology must adhere well to aluminum, be wettable by typical tin solder formulations, and be highly conductive. A structure meeting these requirements is a composite of chromium and copper. Chromium is deposited first, to adhere to the aluminum, and copper is applied over the chromium to provide a solder wettable surface. Chromium is known to adhere well to a variety of materials, organic as well as inorganic. Accordingly it adheres well to dielectric materials, e.g. $SiO_2$, SINCAPS, polyimide, etc., commonly used in IC processing, as well as to metals such as copper and aluminum. However, solder alloys dissolve copper and de-wet from chromium. Therefore, a thin layer of copper directly on chromium will dissolve into the molten solder and then the solder will de-wet from the chromium layer. To insure interface integrity between the solder and the UBM, a composite or alloy layer of chromium and copper is typically used between the chromium and copper layers.

While this UBM coating works well, and is used successfully in the industry, it is a multilayer coating which adds complexity and cost to the IC packaging operation. It also adds a new metallurgy (chromium) to the system. It would be desirable from the standpoint of compatibility and process simplicity, if the materials used in the UBM coating were the same as the base materials being soldered, i.e. copper and aluminum.

SUMMARY OF THE INVENTION

We have developed a new and simpler UBM that uses only aluminum and copper. A thick aluminum layer is provided on the aluminum bonding site of the IC, and a relatively thick copper layer is adhered directly to the aluminum layer. The bonding of copper directly to aluminum, while difficult or impractical to effect by conventional techniques, is easily accomplished by sputter deposition if the aluminum surface is properly prepared. The copper layer can then be soldered to the next interconnect level by conventional means. The new UBM can be used in any interconnection arrangement including surface mount, and is ideally suited for flip-chip assembly.

DETAILED DESCRIPTION

Figure 1:
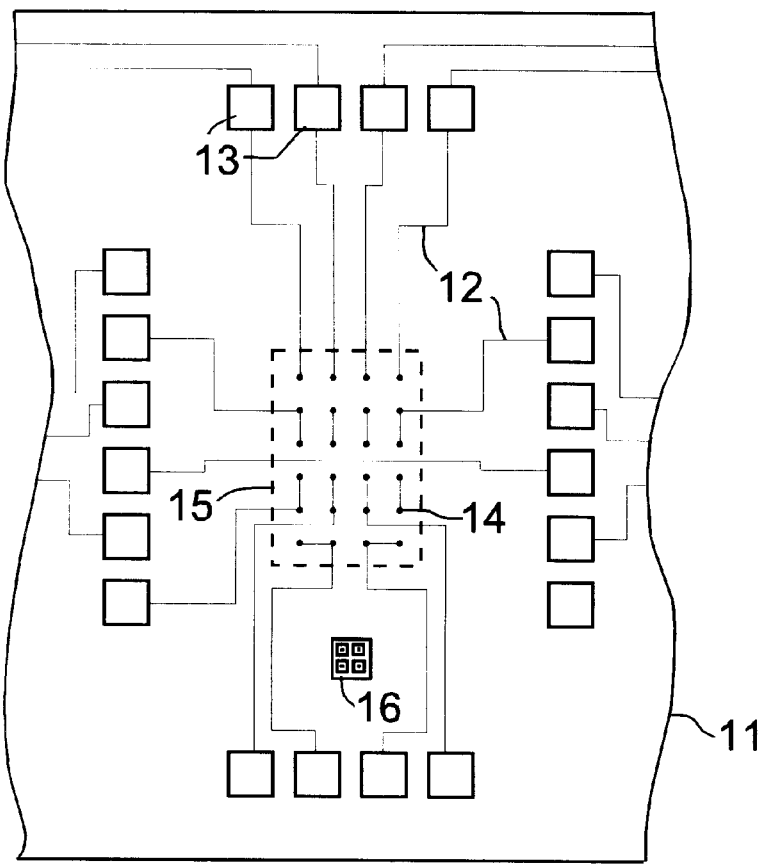
FIG. 1 is a schematic diagram of printed circuit board adapted for flip-chip bonding of an IC chip to an array of solder bump contacts on the board and the flip-chip.

Referring to FIG. 1, a cutaway portion of a printed circuit board 11 is shown with a printed circuit of runners 12 interconnecting the outer arrays of I/O contact pads 13 with a 4×6 array of solder bumps 14. The figure shows a site 15, in phantom, for a flip-chip component to be installed. The entire board may contain several or many flip-chip sites depending on the size of the assembly and the size of the various elements. In the embodiment shown in FIG. 1 the outline of the flip-chip package 15 is approximately 4×7 mm and the 4×6 array of solder bumps 14 is slightly smaller. A capacitor is shown at 16. The printed circuit of FIG. 1 is for a single in-line memory module (SIMM), but the technology in general, and the invention, potentially covers a wide variety of solder mounted devices, and applies to other interconnecting substrates as indicated earlier.

Figure 2:
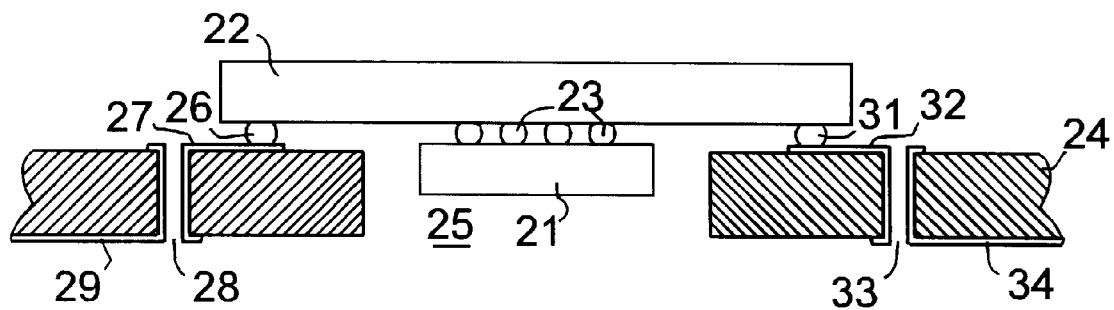
FIG. 2 is a schematic representation in partial cross section of a conventional interconnection system for flip chip packages.

Referring to FIG. 2, a recessed-chip module is shown comprising IC chip 21 and intermediate interconnection substrate (IIS) 22. The IIS can be any suitable material such as epoxy or ceramic, but is preferably silicon. The chip 21 is flip-chip bonded to IIS 22 by interconnections 23 which are typically solder, but may be other conductive material such as conductive epoxy. The technique used for the flip-chip bond is not part of the invention and may e.g. be solder bump or ball bonding, or conductive epoxy etc. The IIS tile 22 is in turn flip-bonded to printed wiring board (PWB) 24 with solder or conductive epoxy I/O interconnections 25. In a recessed chip MCM the PWB 24 is provided with a cavity 25 so that the chip 21 can be recessed below the PWB surface as shown. The cavity may extend through the thickness of the PWB as shown in FIG. 2, or may extend only partially through the PWB. In the arrangement shown the PWB is a single level board with dual side printed circuits. It could also be a multilevel PWB. The PWB may be interconnected to a system printed wiring board (not shown). A cutaway portion of the PWB is shown to illustrate that the PWB is a portion of a larger PWB that may accommodate several IISs.

The IIS 22 may be an active device, such as a quad package, with a large array of I/O bonding sites arranged in a square or rectangular configuration at the periphery of the substrate. Alternatively the IIS may be a passive interconnection substrate, such as silicon, with a printed circuit on one or both sides. In the interconnection arrangement shown in the FIG. 2, the solder ball 26 is bonded to a bonding pad on the PWB 14, and the pad is interconnected by runner 27 that extends to plated through hole interconnection 28, and then via runner 29 on the bottom of the PWB to another contact site (not shown). The other contact site may be another bonding pad, if the PWB is to be soldered to another board, or if wire bonds are made to the PWB. Alternatively, e.g., the contact sites may be slot interconnections if the PWB is a plug-in circuit card. For the purpose of this description the interconnection shown by 26, 27, 28, and 29 is a power interconnection, and the similar interconnection comprising elements 31, 32, 33, and 34 is a ground interconnection. The remaining I/O connections are not shown but are conventional.

Figure 3:
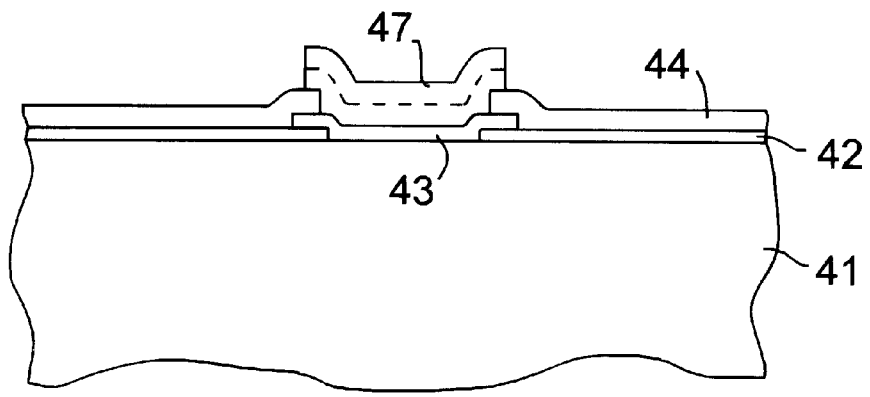
FIG. 3 is a more detailed view of the IC chip that is interconnected in the arrangement of FIG. 2.

FIG. 3 is a schematic representation showing in greater detail the bonding sites on the IC chip. The figure would also be representative of other interconnect substrates that have aluminum metallization at the bonding sites. In FIG. 3, the IC substrate 41 is shown with oxide layer 42 and an aluminum bonding site 43 formed in a window of the oxide layer. A capping layer of polyimide, or SINCAPS, is shown at 44. It will be recognized by those skilled in the art that the figures are not drawn to scale. The bonding site 43 may be an interlevel metal interconnection or a substrate, e.g. source drain window, contact. Details of the underlying semiconductor structure are not shown and are not critical to the invention. The objective is to cover the surface of the aluminum bonding site 43 with a UBM coating, then a ball, or bump, of solder. Accordingly the UMB 47 is applied selectively to the contact area 43.

Conventional UBM is frequently applied using an additive process, such as a lift-off mask. However, subtractive processes are preferred since they are simpler, and provide smaller features with better dimensional control. An advantage of the UBM of the invention is that it can be selectively applied by a subtractive process, i.e. blanket deposition, lithographic masking, and etching.

The UBM layered structure of the invention is formed by sputtering the aluminum and copper layers in the sequence described below. The process will be described in conjunction with FIGS. 4–6.

Figure 4:
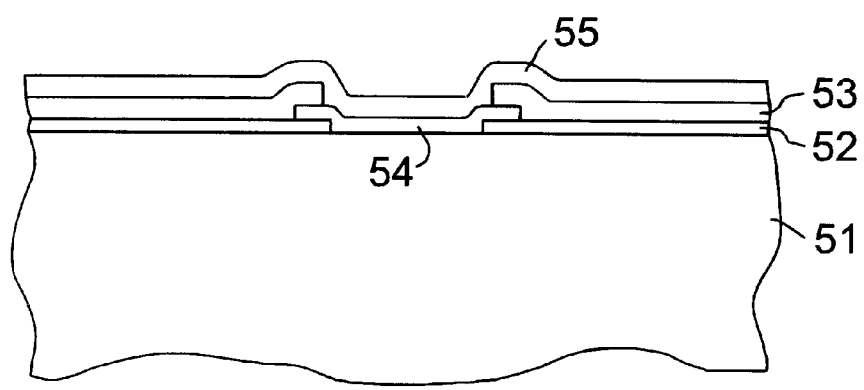
FIGS. 4–8 are schematic representations of steps used to form the under bump metallization according to the invention.
Figure 5:
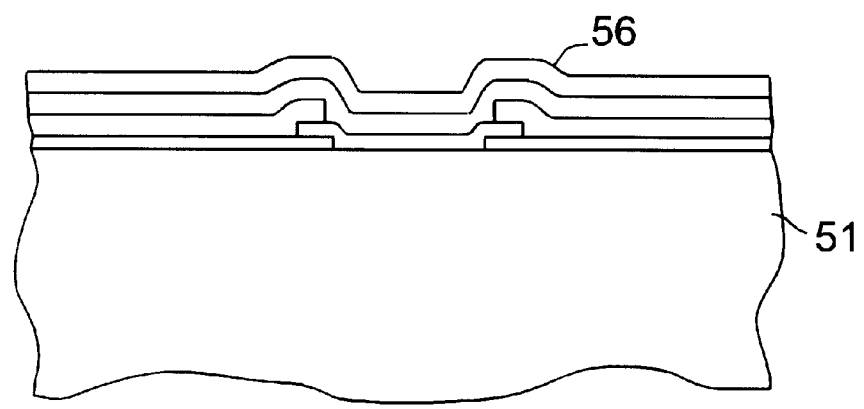

In FIG. 4, a portion of the substrate is shown at 51, with oxide shown at 52, capping layer at 53, and aluminum bonding site at 54. This is the usual structure of an IC chip package prior to flip-chip assembly. Before applying the UBM layers, the surface of the aluminum contact is first cleaned using a mild etch, or by back sputtering, to ensure adhesion of the deposited aluminum. The aluminum UBM layer 55 is then deposited by sputtering from an aluminum target. The thickness of this layer, combined with the thickness of the aluminum contact pad 54 on the IC, should be in the range 0.5–2.0 microns. The thickness of the aluminum interconnect layers in current IC technology is typically of the order of 0.5 $\mu$m or less. The deposited UBM aluminum layer will generally be in the range 0.1 to 2 $\mu$m. With reference to FIG. 5, the copper layer 56 of the UBM is then sputtered directly over the aluminum. It is most efficient to deposit both UBM layers sequentially in the same apparatus without breaking vacuum. Otherwise the aluminum layer should be back sputtered to remove native oxide that forms on the surface of the aluminum if the steps are conducted in separate to tools, or with a break in vacuum. Therefore, in the preferred embodiment, the layers are sputtered in a sputtering apparatus containing both an aluminum target and a copper target. Preferably this is done in a cluster tool with an Al deposition station and a Cu deposition station. Appropriate sputtering techniques and conditions are well known. Other techniques for depositing the metal layers, e.g. evaporation, can also be used as long as the surface of the aluminum layer is protected or cleaned appropriately before the copper layer is deposited.

The copper layer 56 preferably has a thickness in the range 0.5–2 $\mu$m. The copper layer is wettable with solder materials commonly used for solder bumps. The melting point of most copper eutectics with tin solders is relatively low, and at the soldering temperature the surface of the copper layer dissolves in the solder bump forming a physically and electrically sound bond. Even if all the copper dissolves into the solder layer the solder will still wet and bond to the Al layer because the surface of the aluminum layer is oxide free.

Figure 6:
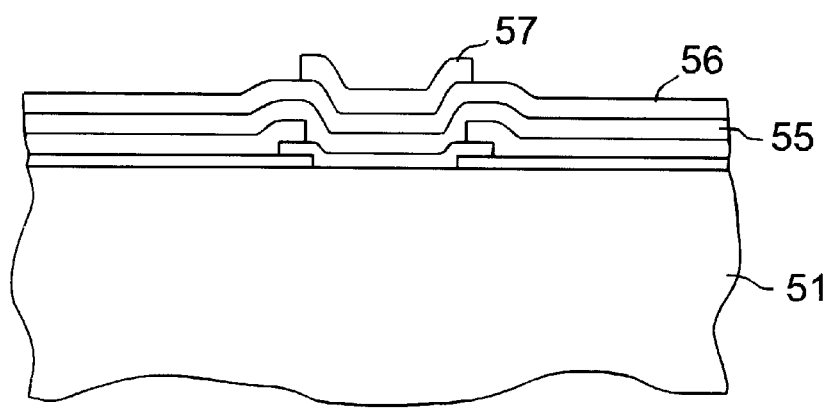

As shown in FIG. 6 an etch mask 57 is applied to mask the solder bump area. The etch mask is preferably a conventional photoresist and is formed by spinning photoresist on the surface layer and patterning the photoresist with suitable actinic radiation. FIG. 6 shows the developed photomask. Alternative masking techniques can be used such as e.g. an oxide hardmask. Other lithographic processes can also be used, e.g. e-beam or x-ray.

Figure 7:
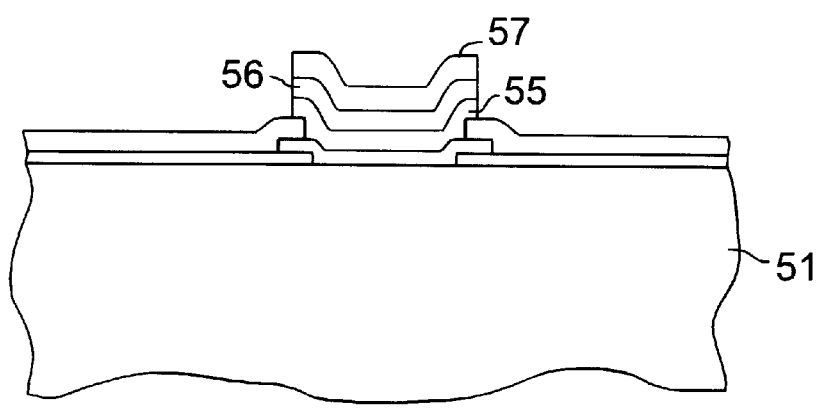
Figure 8:
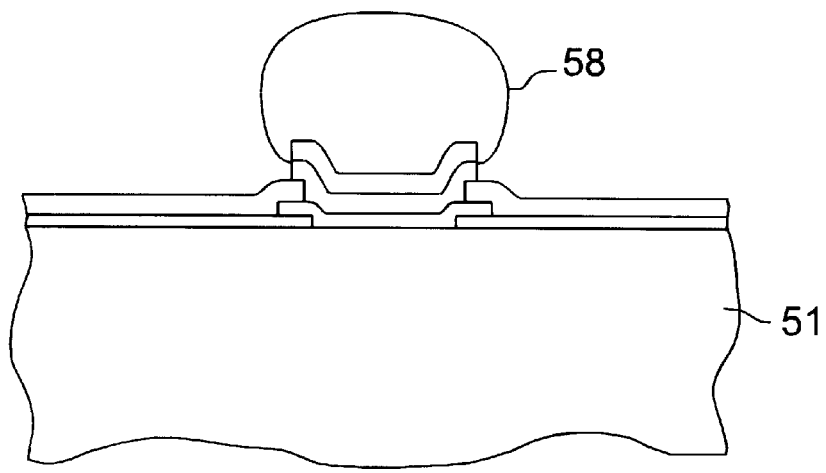

With the photomask in place the copper layer 56 and the deposited aluminum layer 55 are etched using conventional etchant solutions. Copper is etched with, e.g., iron chloride, a mixture of sulfuric acid and potassium chromate, or sulfuric acid and peroxide. Aluminum can be etched with diluted HF or PAE etchant. The resulting structure is shown in FIG. 7. With reference to FIG. 8, the photomask 57 is removed, and solder bumps or balls 58 applied to the UBM by a conventional method.

The following example is given to demonstrate the effectiveness of the invention.

EXAMPLE

Deposition of the metal layers 55 and 56 is performed on a Sputtered Films Inc. Endeavor cluster tool. Wafers are baked at 105° C. for 1 hour prior to deposition. The wafers are then loaded into the cassette module of the apparatus. The wafers are given a preliminary clean, which is a mild dry etch in the etch station of the cluster tool. The etch conditions are 350 W for 120 s with an Ar flow of 6 sccm. The wafer is then moved to the Al deposition chamber while keeping the wafer under vacuum. Approximately 1 $\mu$m of Al is deposited under the following conditions: 10 kW for 60 s at an Ar flow of 5 sccm with the substrate biased by 400 W of energy for the initial 30 s of deposition. The wafer is is then moved to the Cu deposition chamber where approximately 1 $\mu$m of copper is deposited under the following conditions: 4 kW for 400 s at an Ar flow of 45 sccm. The wafer is then returned to the cassette module for unloading.

The coated wafers are then patterned by conventional lithography. Wafers are placed in a YES vapor prime oven with an adhesion promoter, e.g. HMDS, for 5 min. The wafers are spin coated with 5 $\mu$m of AZ4620 photoresist on a MTI Flexifab track, and softbaked for 1 min. at 100° C. Patterns are exposed in the resist using a GCA stepper exposure system (t=30 s, or about 200 mJ), and developed with AZ400k developer (t=2 min.). The wafers are then hardbaked on a hotplate at 130° C. for 2 min. prior to etching the copper layer. The copper layer is etched using: H₂SO₄:H₂O₂:H₂O. The wafers are then rinsed in water and placed in a commercial Al etch, PAE etchant) to etch the Al layer. They are then rinsed dried and inspected. The photoresist is stripped in PRS1000 for 30 min. @ 100° C. The resulting wafers have selectively applied UBM of Al/Cu with the copper surface layer ready for soldering.

The solder coating over the UMB layer is formed by any suitable technique such as evaporation. The thickness of a typical solder bump for this application is 3–20 mils. Examples of solder compositions that can be used successfully in the processes described above are:

TABLE 1

|    | I  | II | III |
|----|----|----|-----|
| Sn | 5  | 63 | 95  |
| Pb | 95 | 37 | 0   |
| Sb | 0  | 0  | 5   |

Soldered IC components with this UBM meet rigid testing and IC performance standards.

It will occur to those skilled in the art that deposition of aluminum layer 55 can be dispensed with if the IC fabrication process provides aluminum bonding sites with sufficient thickness. Thus in the practice of this invention, the final metal layer, or pads at the bonding sites, produced in the fabrication sequence for the IC can be made with a thickness of at least 0.5 μm. In this case it is only necessary to remove the native oxide from the surface of the aluminum prior to copper deposition. The dry etch preclean described above may be used for this.

The preclean step for aluminum layers that have been produced prior to the process of this invention, i.e. have been exposed to air, is important to the success of the process. It is preferred that the surface of such layers be dry etched, i.e back sputtered or RIE, to provide a clean aluminum surface for the copper deposition. Removing at least 100 Angstroms, and preferably 400 Angstroms, from the surface will produce the desired surface condition. For the purpose of defining the invention such a surface is termed a nascent surface. A nascent surface is also provided when an aluminum layer is deposited in a vacuum apparatus.

As stated above, an advantage of the process described above is that subtractive processes, i.e. photomasking and etching, can be used to apply the UBM. Other subtractive processes for UBM are known, see e.g. U.S. Pat. application Ser. No. 08/825,923, filed Apr. 2, 1998. In this process chromium is used in the UBM. The etchant used to pattern a chromium layer attacks Al aggressively. Therefore the process is not ideal if the surface to which the UBM is applied contains bare Al bonding sites. This situation arises in some packaging applications, notably chip-on-chip where the second level chip, i.e. the chip supporting the first chip, is at least partially wire bonded to the next level. This chip requires both UBM pads and bare Al pads. The Al pads for both types of interconnect can be defined first, and the Al pads that receive UBM are simply selectively coated with copper using the techniques described above. In this situation it is preferable that the thickness of the aluminum layer at the sites to be wire bonded be thick, i.e. at least 1.0 micron, so that the wire bond sites can survive the UBM etch steps. The typical aluminum etch step is very well controlled, and the relative thickness of the layers can be controlled to achieve this result.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A process for bonding an IC chip to a support substrate, said IC chip having aluminum bonding pads, comprising the steps of:

a. placing the IC chip in a vacuum apparatus,
   b. creating a vacuum in the vacuum apparatus, and without breaking the vacuum:
      i. dry etching the aluminum bonding pads,
      ii. depositing a layer of copper on the aluminum bonding pads,
   c. soldering the copper layer to the support substrate.

2. The process of claim 1 wherein the copper layer is selectively deposited on the aluminum bonding pads by depositing a blanket layer on the IC chip, masking selected portions of the blanket layer leaving portions of the blanket layer exposed, and etching away the exposed portions of the blanket layer.

3. The process of claim 2 wherein the aluminum layer has a thickness of at least 0.5 μm.

4. The process of claim 3 wherein the copper layer has a thickness of at least 0.5 μm.

5. A process for bonding an IC chip to a support substrate, said IC chip having aluminum bonding pads, comprising the steps of:

a. placing the IC chip in a sputtering apparatus,
   b. creating a vacuum in said sputtering apparatus, and without breaking said vacuum:
      i. depositing a layer of aluminum on said aluminum bonding pads,
      ii. depositing a layer of copper on said layer of aluminum,
   c. soldering said copper layer to said support substrate.

6. The process of claim 5 wherein said layer of aluminum and said layer of copper are patterned by applying a photoresist to said copper layer, patterning said photoresist to expose portions of said copper layer, and etching away said exposed portions of said copper layer and said underlying aluminum layer.

7. The process of claim 6 wherein the aluminum layer has a thickness of at least 0.5 μm and the copper layer has a thickness of at least 0.5 μm.

8. The process of claim 5 wherein the copper layer is selectively deposited on the aluminum bonding pads by depositing a blanket layer on the IC chip, masking selected portions of the blanket layer leaving portions of the blanket layer exposed, and etching away the exposed portions of the blanket layer.

* * * * *